(12) United States Patent
Liu

(10) Patent No.: US 7,064,039 B2
(45) Date of Patent: Jun. 20, 2006

(54) METHOD TO PRODUCE LOCALIZED HALO FOR MOS TRANSISTOR

(75) Inventor: Kaiping Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 10/785,623

(22) Filed: Feb. 24, 2004

(65) Prior Publication Data

US 2004/0166611 A1   Aug. 26, 2004

Related U.S. Application Data

(62) Division of application No. 10/269,226, filed on Oct. 11, 2002, now Pat. No. 6,743,684.

(51) Int. Cl.
*H01L 21/336* (2006.01)
(52) U.S. Cl. .......................... 438/300; 438/302
(58) Field of Classification Search ............... 438/300, 438/302, 524, 525, 589
See application file for complete search history.

(56) References Cited

U.S. PATENT DOCUMENTS

| | | | |
|---|---|---|---|
| 5,595,919 A * | 1/1997 | Pan | 438/302 |
| 5,937,293 A * | 8/1999 | Lee | 438/247 |
| 6,437,406 B1 | 8/2002 | Lee | |
| 6,458,665 B1 | 10/2002 | Kim | |
| 6,509,241 B1 * | 1/2003 | Park et al. | 438/303 |
| 6,589,847 B1 * | 7/2003 | Kadosh et al. | 438/302 |
| 2002/0068409 A1 | 6/2002 | Chou et al. | |

OTHER PUBLICATIONS

Scott Thompson et al., "MOS Scaling: Transistor Challenges for the 21$^{st}$ Century" Intel Technology Journal, Third Quarter, 1998, pp. 1-19.

* cited by examiner

*Primary Examiner*—Chandra Chaudhari
(74) *Attorney, Agent, or Firm*—Rose Alyssa Keagy; W. James Brady, III; Frederick J. Telecky, Jr.

(57) ABSTRACT

Methods are discussed for forming a localized halo structure and a retrograde profile in a substrate of a semiconductor device. The method comprises providing a gate structure over the semiconductor substrate, wherein a dopant material is implanted at an angle around the gate structure to form a halo structure in a source/drain region of the substrate and underlying a portion of the gate structure. A trench is formed in the source/drain region of the semiconductor substrate thereby removing at least a portion of the halo structure in the source/drain region. A silicon material layer is then formed in the trench using an epitaxial deposition.

14 Claims, 10 Drawing Sheets

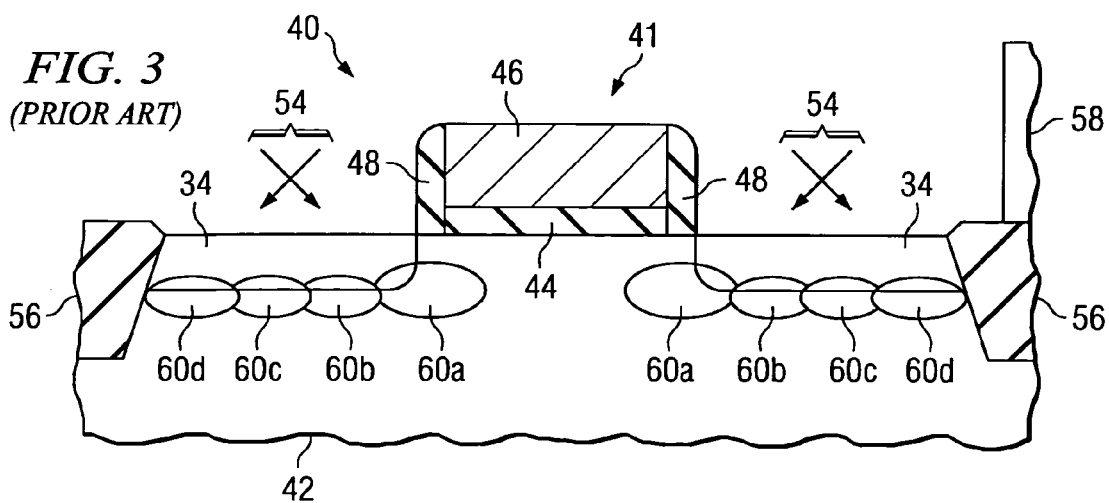
FIG. 3 (PRIOR ART)
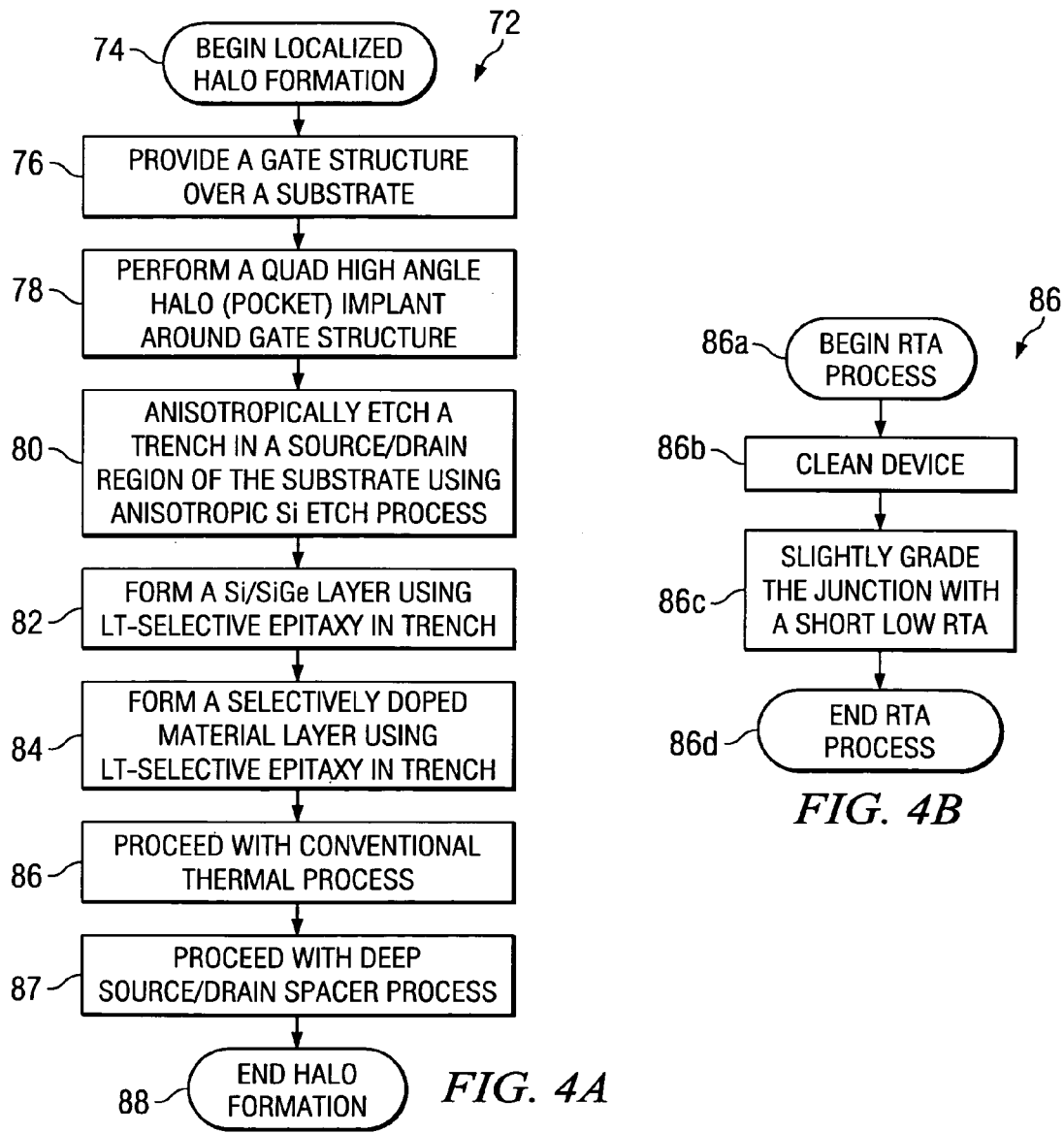
FIG. 4A
FIG. 4B

METHOD TO PRODUCE LOCALIZED HALO FOR MOS TRANSISTOR

This is a division of application Ser. No. 10/269,226, filed Oct. 11, 2002 now U.S. Pat. No. 6,743,684, the entire disclosure of which is hereby incorporated by reference.

FIELD OF INVENTION

The present invention relates generally to semiconductor devices and more particularly to methods for forming localized halo structures in a semiconductor substrate in the fabrication of semiconductor devices.

BACKGROUND OF THE INVENTION

Several trends exist presently in the semiconductor device fabrication industry and the electronics industry. Devices are continually getting smaller, faster and requiring less power. A reason for these trends is that more personal devices are being fabricated which are relatively small and portable, thereby relying on a battery as its primary supply source. For example, cellular phones, personal computing devices, and personal sound systems are devices which are in great demand in the consumer market. In addition to being smaller and more portable, personal devices are requiring more computational power and speed. In light of all these trends, there is a need in the industry to provide smaller and faster MOS transistors used to provide the core functionality of the integrated circuits used in these semiconductor devices.

The phenomenal success of the MOS transistor has been partially due to the capability of the MOS transistor to take advantage of the lateral scaling improvements in the technologies. Lateral scaling results in simultaneous improvements in both the performance and the packing density of the devices. Although generalized scaling has served well for the last few decades, many of the technology advances that allow the devices to continue improving the performance and the packing density are approaching fundamental physical limitations. Future device improvements will require the devices to be either optimized for voltage reduction, high performance, or reliability.

Gate oxide thickness, junction scaling, and well engineering in MOS devices has enabled channel length scaling by improving short channel characteristics. By changing the doping profile in the channel region, the distribution of the electric field and potential contours can be changed. The goal is to optimize the channel profile to minimize the off-state leakage while maximizing the linear and saturation drive currents. Channel doping optimization can improve the circuit gate delay, for example, by about 10% for a given technology. Super Steep Retrograde Wells (SSRW) and halo implants (or pocket implants) have been used as a means to scale the channel length and increase the transistor drive current without causing an increase in the off-state leakage current.

Retrograde well engineering changes the 1-D characteristics of the well profile by creating a retrograde profile (the subsurface concentration is higher than the surface concentration) toward the $Si/SiO_2$ surface of a MOS device. The halo architecture creates a localized 2-D dopant distribution near the S/D regions and extends under the channel. Halos are generally known for their ability to stop unwanted source/drain leakage conduction, or punchthrough current, and as such, are sometimes referred to as a "punchthrough stopper".

The retrograde well profile has been used to improve device performance and is typically created by using a slow diffusing dopant species such as arsenic or antimony for PMOS devices and indium for NMOS devices. Retrograde wells may only slightly improve saturated drive currents relative to uniform wells, but with today's deep sub-micron technologies, significantly improve linear drive currents and lead to improved circuit performance.

Additional benefits and improvements attributable to a theoretically ideal halo with optimal retrograde dopant profiles will be discussed in association with FIG. 1. FIG. 1 illustrates a 2-D simulation 1 of a true localized and optimal halo profile together with a potential profile for a MOS transistor. The MOS transistor comprises a gate 2 having a channel length 2a, a gate-oxide 3 having a thickness $t_{OX}$ 3a, and a semiconductor substrate 4 with source/drain regions having a depth 4a on either side of a channel region.

Several graded profiles are illustrated within a channel portion of the semiconductor substrate 4, exhibited by a generally vertically retrograde profile 5a, a generally laterally graded profile toward the center of the channel 5b, and a generally diagonally graded profile toward the source/drain regions 5c. Implanted dopant concentrations symbolized by solid lines 6–13, range from a high concentration p-type dopant 6, thru a zero dopant concentration 9, to a high concentration n-type dopant 13 to produce the retrograde profiles 5a, 5b, and 5c. The centers of highest p-type dopant concentration 6, each form the center of the optimal halo.

In the MOS transistor of FIG. 1, a dopant concentration profile below the surface channel is preferably a vertically retrograde profile 5a toward the substrate surface to provide for high carrier mobility close to the surface under the gate. Since dopant impurities scatter mobility carriers and degrade linear drive current, ideally the dopant concentration near the substrate 4 surface is low. At the same time, the vertically retrograde profile 5a provides the highest p-type dopant concentration 6 areas below the surface which advantageously tend to block subsurface currents and further redirect the source/drain current toward the surface.

Profile 5b is laterally graded toward the center of the channel (and across the channel) from the regions of the highest p-type concentration 6 for maintaining and controlling the Vt roll-off. Profile 5c is diagonally graded toward the source/drain regions to minimize tunneling current and body-to-source/drain junction capacitance (Cjbw).

Further, the retrograde profile associated with the lower channel portion would ideally extend under the source/drain regions to minimize the body-to-source/drain junction capacitance (Cjbw), to minimize tunneling current, and to minimize the source-drain resistance Rsd. The Rsd would be minimized because less compensation of the dose to the highly doped source/drain areas would be required. A low Rsd allows less potential (voltage) drop across the highly doped source/drain region, thus more potential will drop across the channel 2a. It is the amount of potential drop across the channel that determines the amount of drive current.

Together, profiles graded in the above manner would provide halos centered around the high p-type concentration 6 areas, and would tend to direct source/drain current toward the substrate surface while blocking subsurface currents, control Vt roll-off, and minimize Cjbw, tunneling current and Rsd.

In addition, as device densities and operational speeds continue to increase, reduction of the delay times in the MOS devices used in integrated circuits is desired. These delays are related to the on-state resistance as well as the junction capacitances of these MOS devices. In order to reduce these delays and increase MOS device speeds, improved halo profiles as indicated are desired. Further, increasing device densities also result in a reduced source to drain distance, which requires that halo dopant concentrations increase and move closer to the surface of the substrate. These changes may result in a disruption to the operation of a MOS transistor. In these and similar circumstances, a vertically retrograde profile may help to avoid or mitigate some of the problems encountered in the scaling of MOS devices.

Several prior art methods have been used to create halo-type structures. One such method is the "solid source diffusion" approach, which creates a halo-type structure from a highly doped spacer.

FIGS. 2A–2D illustrate a prior art method of forming a halo-type structure in a MOS transistor 20 according to the "solid source diffusion" method. Initially in FIG. 2A, the MOS transistor 20 comprises a gate structure 21 formed over a semiconductor substrate 22. Gate structure 21 comprises a gate-oxide material layer 24 formed over the semiconductor substrate 22, a polysilicon material layer 26 formed over the gate-oxide 24, and an offset spacer 28 comprising a diffusion source material formed surrounding the gate-oxide material layer 24 and the polysilicon material layer 26. Typically, during the deposition formation of the offset spacer 28, a relatively high concentration dopant may be implanted in-situ with the offset spacer material.

In FIG. 2B, during a high temperature direct thermal process DT, dopant diffuses 29 from the spacer 28 into areas of the semiconductor substrate 22 underlying the spacer 28 to form a crude halo-type structure 30. In FIG. 2C, a sidewall spacer 32 is formed over or replaces the offset spacer 28 of the gate structure 21 to provide a larger overall spacer thickness 32', which will be used to guide a deposition of a source/drain region. In FIG. 2D, source/drain regions 34 are then formed by implanting into the semiconductor substrate 22 to a predetermined depth 34' of the MOS transistor 20.

Although the "solid source diffusion" method described provides a halo-type structure, which may block source/drain leakage currents, the high dopant concentration near the surface of the substrate where the dopant originated, also causes a reduction in carrier mobility and a higher Rsd value. This method is therefore typically unable to produce the desirable retrograde profile toward the surface and toward the source/drain regions. Further, the sharp definition between the halo and the source/drain regions also may cause tunnel diode current problems. From a thermal budget standpoint, the relatively high temperature during the direct thermal process step may also be disadvantageous. The "solid source diffusion" method is therefore generally unsuitable for the high device density and high-speed semiconductor applications contemplated.

The "replacement gate" approach is another method to generate a halo-type structure. The "replacement gate" approach (not shown) creates a halo-type structure by first forming a gate structure with a surrounding spacer of oxide material, then masking and removing the gate. A high-angle implant is then performed thru an exposed gate area of the substrate to implant the area underlying the spacer. A gate material is subsequently deposited and the gate is redefined with a mask layer and an etch process, and proceeding with the standard deep S/D implant process.

The "replacement gate" approach, however, may also produce a number of negative side-effects. The doping of all the long channel devices will typically be affected by the implant, which may produce a Vt which is too high or has too much Vt roll-off. This approach is unable to produce a laterally graded profile across the channel, for further Vt roll-off control. Finally, the "replacement gate" approach is unlikely to achieve a vertically retrograde profile if a channel implant amorphous layer exists, because a very high dose (dopant concentration) is needed for the halo.

A large-tilt-angle implant can be used to fabricate halo-type structures, usually with the use of a side spacer to protect the gate structure from unwanted dopant contamination. Prior art FIG. 3, however, illustrates the non-uniform results of a typical quad high-angle implant in a conventional MOS transistor 40, which may be similar in the initial structure to MOS device 20 of FIG. 2a.

In FIG. 3, the MOS transistor 40 comprises a gate structure 41 formed over a semiconductor substrate 42. Gate structure 41 comprises a gate-oxide material layer 44 formed over the semiconductor substrate 42, a polysilicon material layer 46 formed over the gate-oxide 44, and an offset spacer 48 comprising an oxide material formed surrounding the gate-oxide material layer 44 and the polysilicon material layer 46.

A quad high-angle (QHA) implant 54 is performed on the MOS transistor 40, wherein four separate high angle implants are done on the device wafer, each implant performed on the wafer held in a position, then rotationally indexed by 90 degrees. Although the QHA implant 54 beneficially permits implantation of dopant underlying the gate structure, the gate structure 41, STI 56, and the TAP (photo resist material) 58 structures also shield some areas of the semiconductor substrate 42 from being implanted at one or more of the four implant angles. Thus, not all areas receive the same uniform dopant concentration.

For example, FIG. 3 also illustrates four areas of non-uniform dopant concentration 60a–60d at the general depth of interest for the formation of the halo region. Dopant concentration area 60a underlying the edge of the gate structure 41, for example, receives only one of the four QHA implants 54, for a ¼ dose. By contrast, dopant concentration areas 60b and 60c, are in open areas midway between the gate structure 41 and the STI 56/TAP 58 structures, which receive generally all four QHA implants 54, for a full 4/4 dose. Finally, dopant concentration area 60d, which is only shielded by the STI 56/TAP 58 structures for one of the four QHA implants 54, will likely receive a ¾ dose.

Thus, several difficulties are also encounter in the conventional QHA implant 54 formation of a halo of FIG. 3. Areas underlying the edge of the gate structure 41 are implanted to a relatively low dose level with a non-uniform distribution, while the bulk of the implant is received in other unwanted areas (e.g., in the source/drain regions). Dopant received in these unwanted areas increases junction capacitance and may cause body leakage, resulting in reduced switching speeds and higher Rsd. The Rsd is increased for the following reasons: Because the halo implant first enters at the substrate surface, the dopant concentration is also highest at the surface. In a subsequent step, the source/drain region then receives a dose having the opposite dopant polarity, thus the HDD dose requires compensation, which increases the Rsd.

Halo implants have been used as an additional means to scale channel length and increase transistor drive current without causing an increase in the off-state leakage current of high-speed, high-density MOS devices. Several conventional approaches to create a halo-type structure have been discussed such as the "solid source diffusion" approach, the more complex "replacement gate" approach, and the conventional high-angle implant method. However, several problems encountered with each of these conventional approaches exist. Therefore, it is desirable to provide an improved method of forming a localized halo structure to take advantage of the potential performance benefits in a MOS transistor, and in the manufacture and fabrication of such semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to methods for forming a localized halo having a retrograde profile in a semiconductor substrate in the fabrication of semiconductor devices. The invention provides for the formation of the halo structure in an area localized to, and generally underlying the edge of a gate structure. The dopant concentration profiles produced in association with the halo structure, according to the inventive method, yields beneficially ideal retrograde profiles directed toward the surface and the center of the channel and toward the source/drain regions.

In an attempt to approximate and implement the formation of retrograde dopant concentration profiles associated with a halo region in a semiconductor substrate of (e.g., a MOS transistor), several aspects of the present invention are provided. One aspect of the invention provides a method which comprises providing a gate structure overlying a semiconductor substrate, implanting a dopant material at an angle around the gate structure to form a halo structure in a source/drain region of the semiconductor substrate and underlying a portion of the gate structure. A trench is then formed in the source/drain region of the semiconductor substrate, thereby removing at least a portion of the halo structure in the source/drain region. A silicon material is then formed in the trench using, for example, epitaxial deposition.

The trench, in this aspect of the invention, is used to remove unwanted portions of halo dopant from the source/drain regions which do not underlie the gate structure. Removing the unwanted dopant and replacing it with intrinsic silicon, for example, lowers the body-to-source/drain junction capacitance (Cjbw), lowers the tunneling current, and lowers the source/drain on-state resistance Rsd due to less compensation that is later required in the source/drain regions.

In one aspect of the invention, the trench is only partially refilled with an undoped silicon material layer (e.g., Si, or SiGe) in a low temperature selective epitaxial deposition (LT-SEpitaxy, or simply LT-SE), then the remainder of the trench is filled with a doped silicon material layer (e.g., Si/SiGe and Boron, or Si/SiGe and As) in a second LT-SE deposition.

In this way, the depth and concentration of the selectively doped silicon material layer may be controlled, while the underlying intrinsic silicon layer limits source/drain conduction to the substrate surface above the halo. In addition, this also produces an abrupt HDD profile. Alternatively, in contrast with the abrupt dopant change indicated above, a controllably graded profile may be accomplished by slowly ramping-up the dopant concentration during the second LT-SE. Further, by varying the thickness of either layer and controlling the dopant concentration based on, for example, an epitaxial growth rate, a variety of preprogrammed dopant profiles may be obtained.

In a further aspect of the invention, the semiconductor device proceeds to be processed conventionally comprising thermally processing the device, forming a spacer on lateral sidewalls of the gate structure, and performing a source/drain implant into the silicon material layer and the selectively doped silicon material layer to form a source and drain region having a depth that is less than the trench. In another aspect of the invention, the thermal annealing may be a rapid thermal anneal (RTA) used to slightly grade the junction and lower the junction capacitance between the doped and undoped silicon layers.

In another aspect of the invention, the trench is generally filled with an undoped silicon material layer (e.g., Si, or SiGe) using, for example, LT-SE. An HDD implant is then performed into the intrinsic silicon material layer. In this way, the depth and dopant concentration of the implant may be controlled with the time and concentration of the implant, while the underlying intrinsic silicon layer limits source/drain conduction to the substrate surface above the halo. In this method aspect, the dopant implant into the silicon material layer inherently produces a gradation in the dopant concentration without a sharp junction, thereby yielding a lower junction capacitance, if desired.

Again, in a further aspect of the invention, the semiconductor device may be processed conventionally comprising thermally annealing the device, forming a spacer on lateral sidewalls of the gate structure, and performing a source/drain implant into the silicon material layer and the dopant implanted silicon material layer to form a source and drain region having a depth that is less than the trench.

The improved formation method and controllable dopant profiles achievable using the invention may be employed to provide accurate and repeatable formation of localized halo structures to take advantage of some of the potential performance benefits associated therewith.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 3 is a partial cross-sectional side view illustrating a prior art method of applying a quad high-angle implant process to a semiconductor device, and the resulting non-uniform dopant distribution associated therewith;

FIG. 4A is a flow diagram illustrating an exemplary method of forming a localized halo in a semiconductor device in accordance with the present invention;

FIG. 4B is a flow diagram further illustrating an optional clean and rapid thermal anneal step of the method of FIG. 4A;

DETAILED DESCRIPTION OF THE INVENTION

Figure 1:
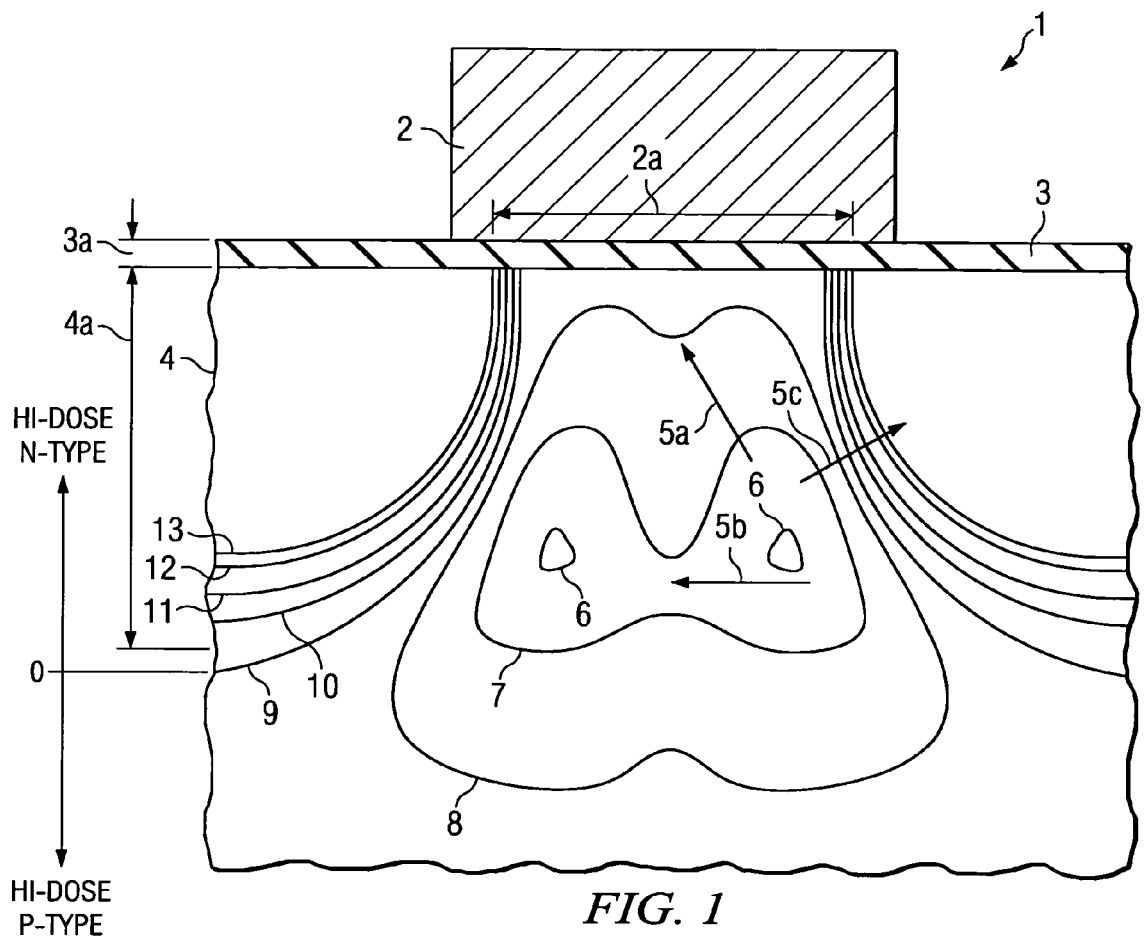
FIG. 1 is a 2-D simulation of a desired halo profile in a MOS transistor, further illustrating several graded profiles formed within a semiconductor substrate.
Figure 2A:
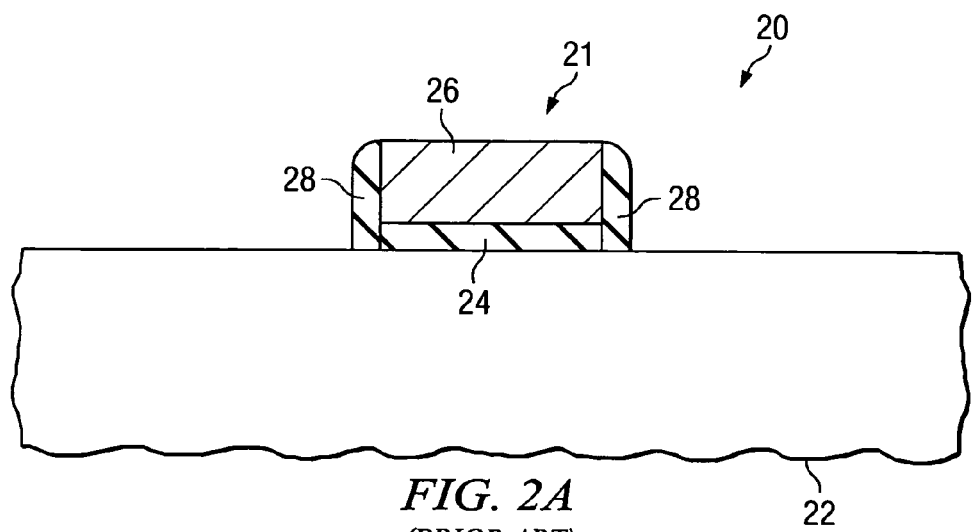
FIG. 2A is a partial cross-sectional side view illustrating a prior art semiconductor device having a gate structure formed thereon, the gate structure having a highly doped offset spacer.
Figure 2B:
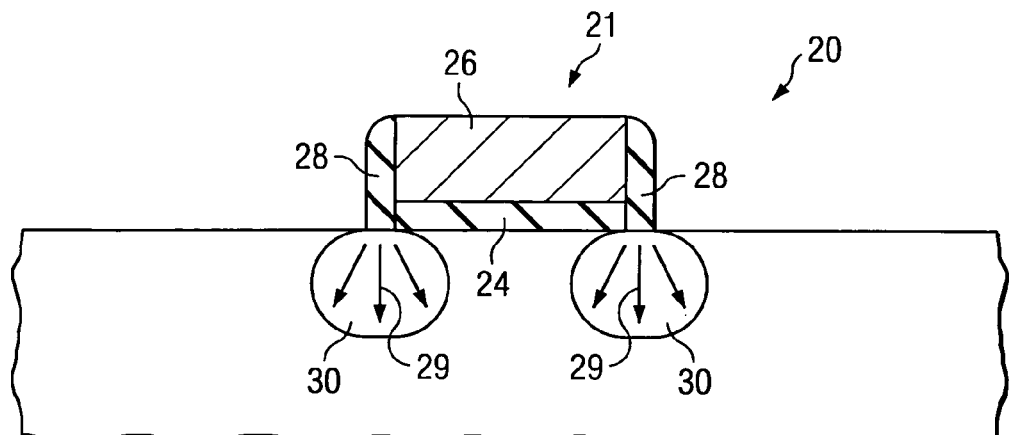
FIG. 2B is a partial cross-sectional side view illustrating formation of a halo-type structure by diffusion from the highly doped offset spacer, the halo-type structure underlying the gate structure of the device of FIG. 2A.
Figure 2C:
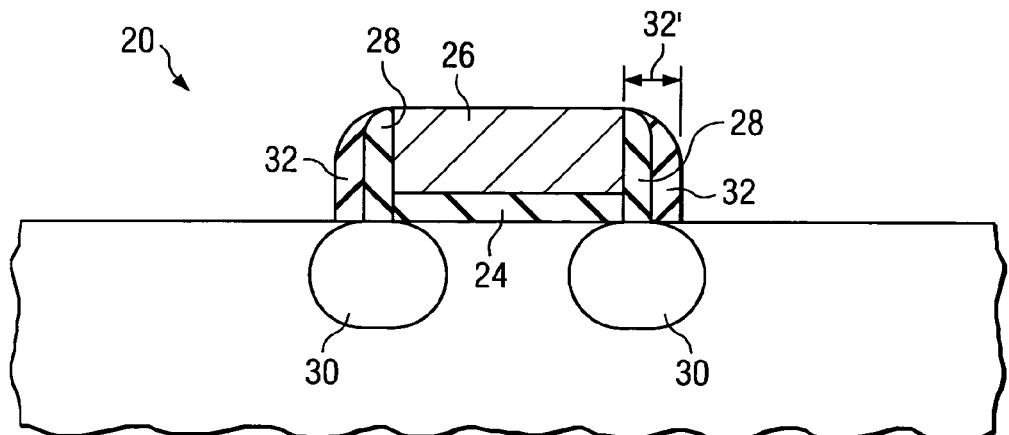
FIG. 2C is a partial cross-sectional side view illustrating formation of a sidewall spacer over the device of FIGS. 2A and 2B.
Figure 2D:
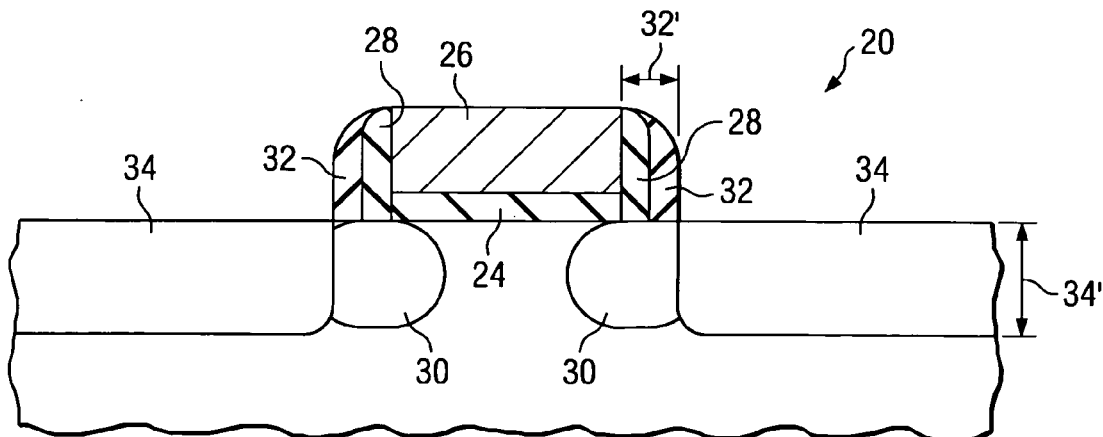
FIG. 2D is a partial cross-sectional side view illustrating formation of a highly doped source/drain region in the device of FIGS. 2A–2C.

The present invention will now be described with reference to the attached drawings, wherein like reference numerals are used to refer to like elements throughout. The invention relates to methods and techniques used in forming localized halo (pocket) structures and shaping the dopant concentration and potential profiles within a semiconductor substrate of a MOS transistor and other such semiconductor devices. One or more implementations of the invention are hereinafter illustrated and described in the context of halo structures and halo structure formation in Si or SiGe semiconductor substrates. However, it will be appreciated by those skilled in the art that the invention is not limited to the exemplary implementations illustrated and described hereinafter. In particular, the various aspects of the invention may be employed in association with the processing of other such substrate materials in devices using various dopants including boron or arsenic, and various dopant concentrations including lightly doped drain LDD or highly doped drain HDD. In addition, various methods of applying the various dopants and concentrations are contemplated by the present invention including dopant implantation into intrinsic silicon material layers or in-situ doping during LT-SE growth.

One aspect of the invention provides methods for forming a localized halo structure and shaping the dopant concentration and potential profiles within a silicon semiconductor substrate. A conventional high angle implant places a halo dose below the edge of a gate structure. A trench is then formed by a vertical anisotropic etch into the substrate between the offset spacer and STI to remove unwanted areas of the source/drain region and a portion of the halo. The trench may be then partially refilled with, for example, a low temperature selective epitaxy process to produce a generally undoped silicon material layer (e.g., Si or SiGe) at the bottom of the trench, followed by an overlying in-situ doped HDD layer. Further the semiconductor device may be processed further comprising thermally annealing the device, forming a spacer on lateral sidewalls of the gate structure, and performing a source/drain implant into the silicon material layer and the dopant implanted silicon material layer to form a source and drain region.

FIG. 4A illustrates one exemplary method 72 for forming a localized halo structure in a semiconductor device in accordance with the present invention, wherein the halo structure may be implanted at a high-angle, then defined and localized in an anisotropic etch step, the trench partially filled in a generally undoped silicon material layer formed in an LT-SE in the bottom of the trench, and an overlying higher selectively doped material layer formed in-situ using an LT-SE process to fill the trench.

While the method 72 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The method 72 involves forming a halo structure within a silicon semiconductor substrate, the halo being localized to an area underlying a gate structure in a MOS transistor of a semiconductor device. Beginning at 74, the halo formation method 72 comprises providing the gate structure, which has been formed over the semiconductor substrate at 76 of the semiconductor device. An upper oxi-nitride layer may be provided over a polysilicon layer of the gate structure, which serves as a hard mask for patterning the poly gate and later etching of a trench. A polysilicon material layer is typically formed over a gate-oxide layer, and an offset spacer comprising an oxide material is formed surrounding the gate-oxide material layer, the polysilicon material layer, and the oxi-nitride hard mask layer.

At 78, a conventional quad high-angle implant places the halo (pocket) dose around the edge of the gate structure in a source/drain region of the semiconductor substrate and underlying a portion of the gate structure. In one example, the high-angle implant places at 78 a p-type halo dopant concentration of about 1.5–2E19 atoms/cm$^3$ at the center of the halos for an NMOS transistor. Other implant concentrations and types of semiconductor devices including PMOS transistors are possible within the scope of the invention.

At 80, an exposed portion of the semiconductor substrate is removed to form a trench in the source/drain region, thereby removing at least a portion of the halo structure in the source/drain region. Because a silicon etch has a high oxide selectivity, the trench may be formed into the silicon substrate using an anisotropic etch, guided by the offset spacer and the STI. The inventor has found that by removing unwanted portions of the halo in this manner, the shape of the halo may be defined and localized. Further, the inventor has realized that removing the unwanted dopant areas of the source/drain region reduces capacitance and leakage effects to substrate areas underlying the source and drain formed thereafter that may otherwise exist.

Thus the trench is formed at 80 at a sufficient depth to remove unwanted portions of dopant from the source/drain regions and the halo structure. Removing the unwanted dopant, beneficially lowers the body-to-source/drain junction capacitance (Cjbw), lowers the tunneling current, and lowers the source/drain on-state resistance Rsd due to less compensation which is later required to an HDD dose in the source/drain regions.

At 82, in one aspect of the invention, the trench is only partially refilled with a generally undoped or intrinsic silicon material layer (e.g., Si, SiGe, or at least a low dose). Such a trench fill is performed, for example, using a low temperature selective epitaxial deposition LT-SE to form a generally undoped silicon material layer at the bottom of the trench. Then, in a second LT-SE at 84, the remainder of the trench is filled with a selectively doped silicon material layer (e.g., Si/SiGe and Boron, or Si/SiGe and As), to provide an in-situ doped HDD layer having an abrupt profile.

Thereafter at 86, the method 72 proceeds, comprising a thermal annealing process on the device, forming a spacer on lateral sidewalls of the gate structure, and performing a source/drain implant into the silicon material layer and the selectively doped silicon material layer to form a source and drain region. In one aspect of the invention, the source/drain regions have a depth that is less than the trench. Finally the halo formation method 72 ends at 88, and subsequent conventional back-end processing may be provided.

Optionally, as described below with respect to FIG. 4B, further details of one exemplary thermal annealing process (e.g., at 86 of FIG. 4A above) is illustrated, comprising a two-step rapid thermal anneal (RTA) beginning at 86a. At 86b, a device cleaning is performed following the second LT-SE (e.g., at 84 of FIG. 1A). Thereafter at 86c, a rapid thermal anneal is performed to slightly grade the HDD junction and lower the junction capacitance between the doped and undoped silicon layers, before the RTA process 86 ends at 86d.

In addition, the halo structure produced as such, beneficially yields a retrograde dopant concentration profile, having retrograde profiles directed toward the surface and the center of the channel and toward the source/drain regions, respectively. The vertically retrograde profile toward the substrate surface provides increased carrier mobility and an increased linear drive current.

Thus, the improved formation method and controllable dopant profiles achievable, in accordance with the invention, may be employed to provide accurate and repeatable formation of halo structures to take advantage of some of the potential performance benefits in a MOS transistor, and in the manufacture and fabrication of such semiconductor devices.

FIGS. 5A–5K illustrate one such implementation, wherein a localized halo structure having a retrograde profile is formed in a semiconductor substrate of a MOS transistor in a semiconductor device. The illustrated portions of the exemplary halo formation process involve the use of an oxi-nitride hard mask, polysilicon and gate oxide layers, as well as oxide materials in offset and sidewall spacers for use in forming a halo. However, it is noted at this point that the invention is not limited to such specific applications, and further that the structures illustrated and described hereinafter are not necessarily drawn to scale.

Figure 5A:
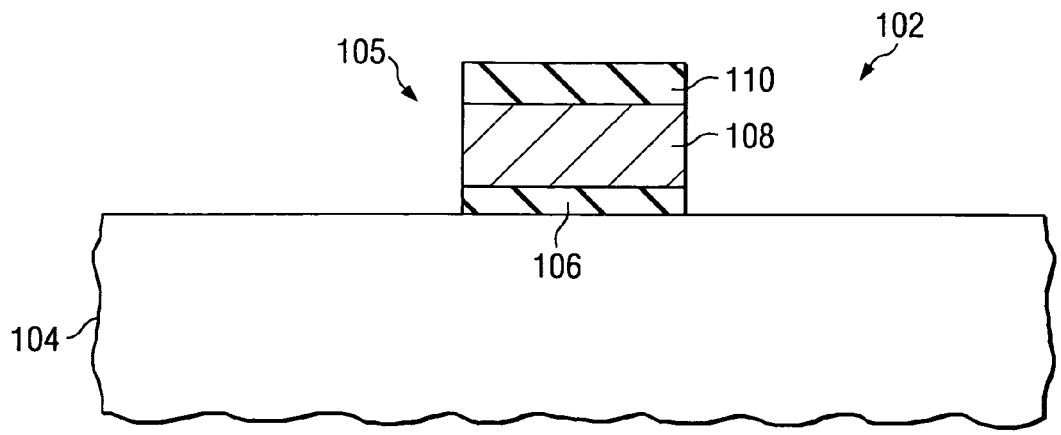
FIG. 5A is a partial cross-sectional side view illustrating an exemplary semiconductor device having a gate structure formed thereon.

In FIG. 5A, a MOS transistor 102 is illustrated at an intermediate stage of fabrication processing of a semiconductor device, wherein the MOS transistor 102 has been formed on or in a semiconductor substrate 104, such as silicon or silicon-germanium.

Initially in FIG. 5A, the MOS transistor 102 comprises a gate stack 105, which is formed over the semiconductor substrate 104. Gate stack 105 comprises a gate-oxide material layer 106 formed over the semiconductor substrate 104, a polysilicon material layer 108 formed over the gate-oxide layer 106, and a hard mask layer 110 comprising, for example, an oxi-nitride material formed overlying the polysilicon material layer 108 and the gate-oxide material layer 106.

Figure 5B:
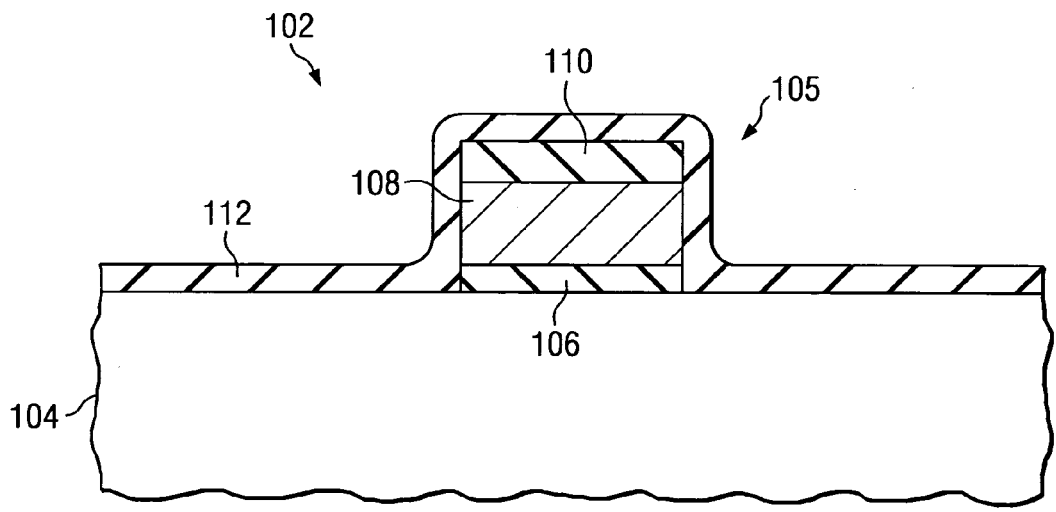
FIG. 5B is a partial cross-sectional side view illustrating formation of an oxide material layer over the device of FIG. 5A.
Figure 5C:
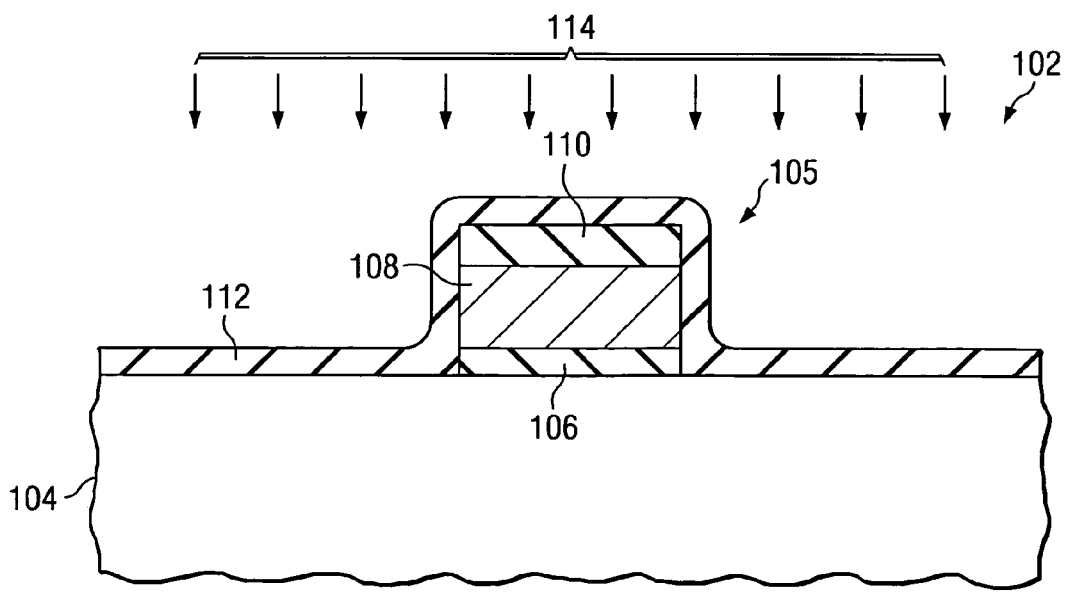
FIG. 5C is a partial cross-sectional side view illustrating an etching of the oxide material layer over the device of FIG. 5B.
Figure 5D:
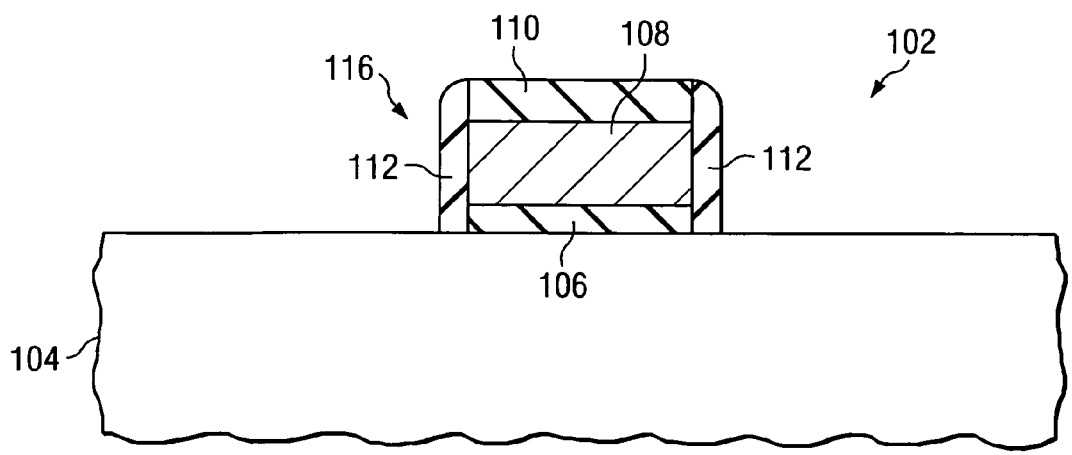
FIG. 5D is a partial cross-sectional side view illustrating the result of the formation of an offset spacer after the etch of the oxide material layer over the device of FIG. 5C.

In FIG. 5B, an offset spacer 112 comprising an oxide material, is formed overlying the gate stack 105 and the semiconductor substrate 104. In FIG. 5C, an anisotropic etch 114 removes lateral portions of the oxide material of the offset spacer 112 to expose the hard mask layer 110 and the semiconductor substrate 104, respectively. FIG. 5D illustrates the final shape of the offset spacer 112, and that of a gate structure 116 formed overlying the semiconductor substrate 104, resulting from the anisotropic etch 114 of FIG. 5C.

Figure 5E:
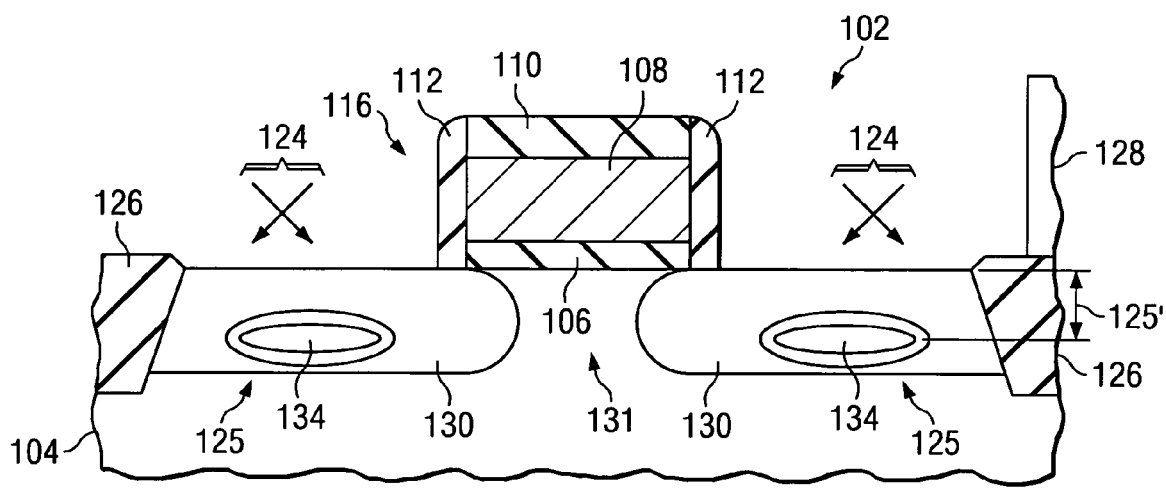
FIG. 5E is a partial cross-sectional side view illustrating performing a quad high-angle halo implant process on a semiconductor substrate of the device of FIG. 5D, and a resulting dopant distribution at a depth of interest.

In FIG. 5E, a quad high-angle halo implant process 124 is performed on the semiconductor substrate 104 of the MOS transistor 102. The high-angle implant 124 results in the formation of a dopant distribution 125 at a predetermined depth of interest 125', and guided between the offset spacer 112 and an STI 126 structure underlying a TAP 128 structure, which have been previously formed but not shown to this point. For example, the dopant distribution 125 may be formed in a lightly doped p-type substrate with p-type dopant concentrations ranging from about 3E19 atoms/cm$^3$ at 130, to about 1 E20 atoms/cm$^3$ at 134. Such a variation in concentration is due to the shadowing effects of the gate structure 116 and any masking 128, as discussed previously. Other transistor types and dopant concentrations are also anticipated in the scope of the present invention.

Because the implant process 124 is performed at a high-angle, and "shadows" under the offset spacer 112 of the gate structure 116, the dopant concentration is formed having a vertically retrograde profile extending toward the substrate surface relative to the dopant depth of interest 125'. Thus, the ideal vertically retrograde profile (e.g., 5a of FIG. 1) is emulated. In addition, because the combination of the high-angle and the exposure timing of the implant process 124, a distance between both halo portions 140 is maintained and a laterally graded profile (e.g., 5b of FIG. 1) toward a center 131 of the channel is emulated.

Figure 5F:
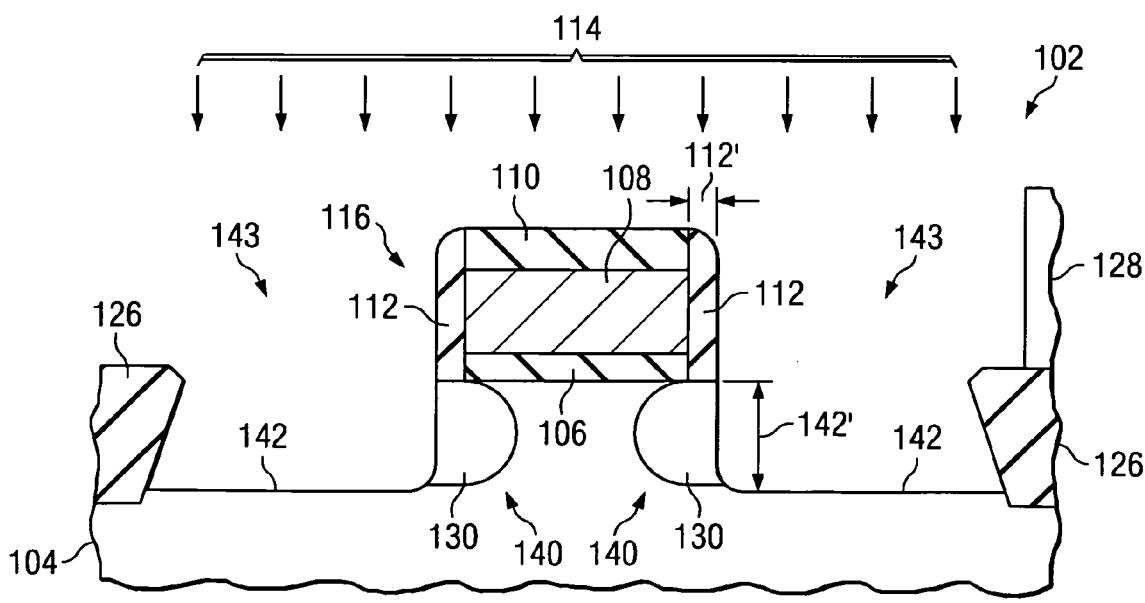
FIG. 5F is a partial cross-sectional side view illustrating anisotropically etching to form a trench in a source/drain region of the semiconductor substrate of the device of FIG. 5E, and further illustrating how the trench is employed to partially define the halo structure.

In FIG. 5F, an anisotropic etch 114 is used to define a halo structure 140 with the formation of a trench 142 in a source/drain region 143 of the semiconductor substrate 104. Thus, the trench 142 defines one wall of the halo structure 140 by removing unwanted dopant from areas associated with the source/drain regions 143, which were implanted during the quad high-angle implant 124.

As previously indicated, the inventor has realized that removing the unwanted halo dopant areas of the source/drain region 143 advantageously reduces capacitance and leakage effects to substrate areas underlying the source and drain formed subsequently. Further, removing the unwanted halo dopant beneficially lowers the body-to-source/drain junction capacitance (Cjbw), lowers the tunneling current, and lowers the source/drain on-state resistance Rsd due to less compensation which is later required to an HDD dose in the source/drain region 143.

Figure 5G:
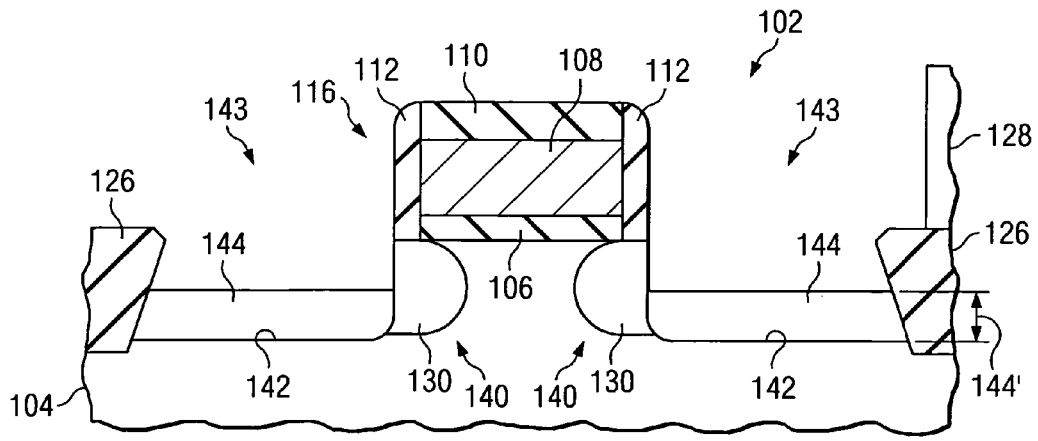
FIG. 5G is a partial cross-sectional side view illustrating a first epitaxial deposition for forming a silicon material layer in the trench of the device of FIG. 5F.

FIG. 5G illustrates a first epitaxial deposition for forming a silicon material layer 144 in the trench 142 of the MOS transistor device 102. The first epitaxial deposition may, in accordance with an aspect of the invention, be a low temperature selective epitaxial deposition LT-SE, used to form an undoped or low dose silicon material layer 144 to a depth 144'. In this manner, the lower portion of the halo structure 140 may be kept isolated from source/drain current conduction paths formed subsequently, as will be more fully appreciated later.

Figure 5H:
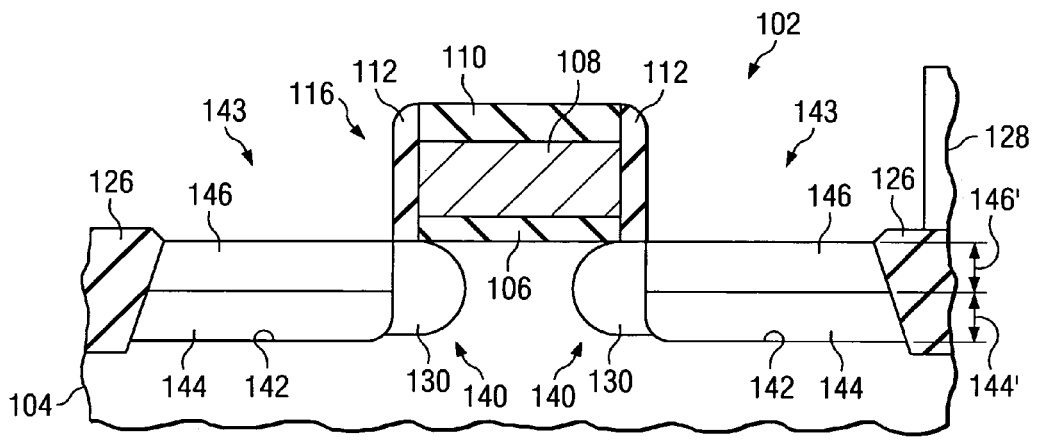
FIG. 5H is a partial cross-sectional side view illustrating a second epitaxial deposition for forming a selectively doped silicon material layer overlying the silicon material layer in the trench of the device of FIG. 5G.

In FIG. 5H, a second epitaxial deposition is employed to form a selectively doped silicon material layer (e.g., Si/SiGe and B, or Si/SiGe and As) 146 to a depth 146' in the trench 142 of the MOS transistor device 102 overlying the silicon material layer 144. For example, during the deposition formation of the selectively doped silicon material layer 146, an n-type HDD dopant may be introduced in-situ with the silicon material. The selectively doped silicon material layer 146 provides the main current path through the substrate surface above the high concentration portion of the halo 140, to couple and direct the current flow through the channel and between the source and drain regions 143.

In one implementation, the underlying intrinsic silicon layer 144 directs source/drain conduction up through the selectively doped silicon material layer 146 toward the surface of the substrate 104 above the high concentration portion of the halo 140 and through the channel. In accordance with an aspect of the invention, the relative depths and concentrations of the undoped and doped silicon layers (144 and 146 respectively) may be easily controlled to tailor the dopant concentration profile of the source/drain region 143. In addition, this also produces an abrupt or a graded HDD profile between the undoped and the selectively doped material layers, depending on the approach to the transition.

For example, by contrast to the abrupt dopant change indicated above, a controllably graded profile may be accomplished by slowly ramping-up the dopant concentration during the second LT-SE. Further, a variety of preprogrammed dopant profiles may be obtained by varying the thickness of either of the trench layers (144, 146) in the source/drain region 143 and/or controlling the dopant concentration based on the epitaxial growth rate.

Figure 5I:
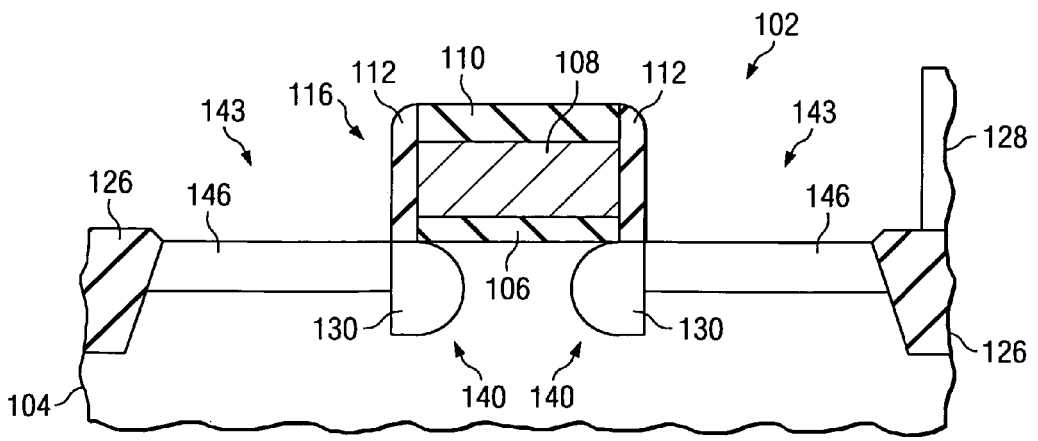
FIG. 5I is a partial cross-sectional side view illustrating the result of a conventional thermal anneal process further illustrating the intrinsic silicon material layer blended into the semiconductor substrate at the bottom of the trench of the device of FIG. 5H.

FIG. 5I, illustrates the result of a conventional thermal anneal process on the MOS transistor device 102, illustrating the blending (Si crystalline repair or regrowth) of the intrinsic silicon material layer (e.g., 144 of FIG. 5H) into the semiconductor substrate 104 at the bottom of the trench 142. In actuality, the substrate is typically a lightly doped p-type silicon material such that diffusion occurs from the substrate into the intrinsic region.

Figure 5J:
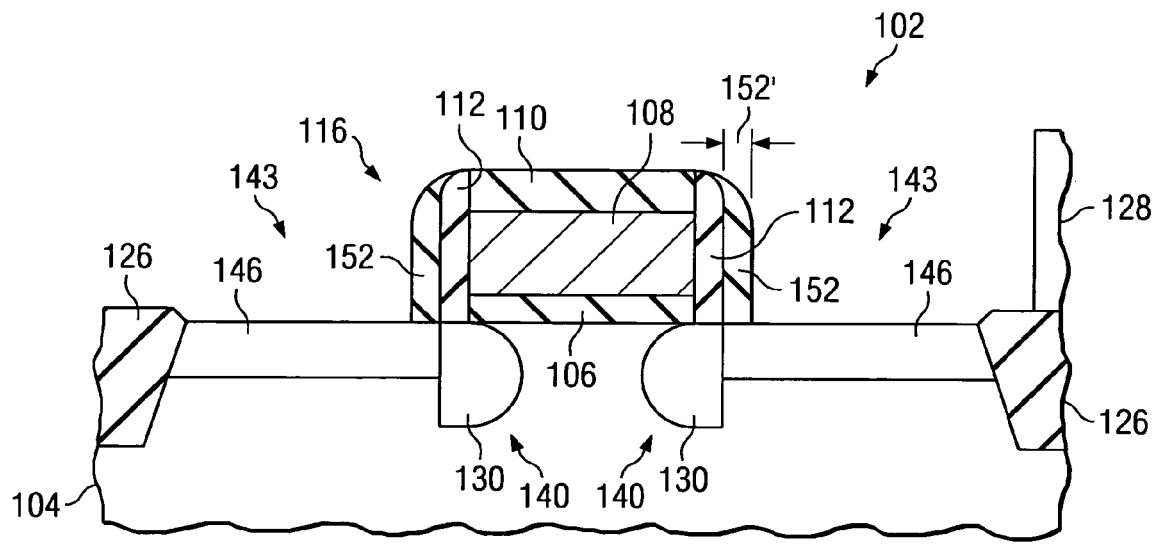
FIG. 5J is a partial cross-sectional side view illustrating formation of a sidewall spacer over the device of FIG. 5I.

In FIG. 5J, a sidewall spacer 152, with a thickness 152' is formed over the offset spacer 112 of the gate structure 116, which will be used to guide a subsequent source/drain implantation in the source/drain region 143.

Figure 5K:
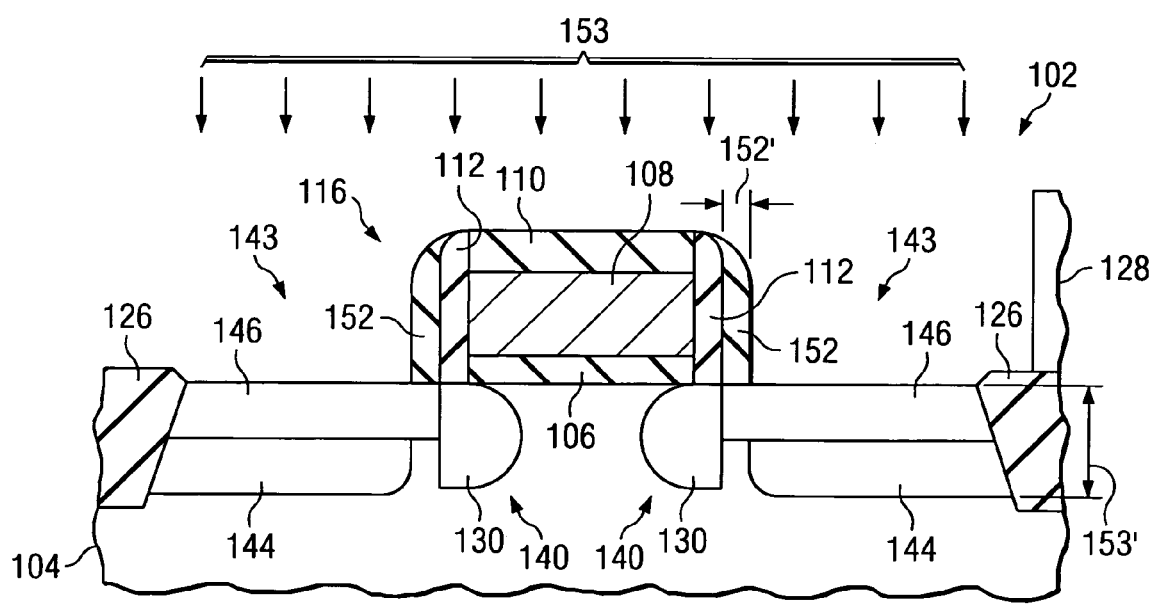
FIG. 5K is a partial cross-sectional side view illustrating a formation of a deep highly doped source/drain region in the device of FIG. 5J.

In FIG. 5K, a conventional deep source/drain deposition 153 is then typically performed, implanting an n-type material to a depth 153' into the source/drain region 143 of the semiconductor substrate 104 of the MOS transistor 102. Sidewall spacer 152, guides the deposition 153 offset by sidewall spacer thickness 152' from the gate structure 116 and the halo structure 140.

Formed as such, a section of the selectively doped silicon material (HDD) layer 146 is shown remaining to couple and direct the current flow up over the halo 140, and through the channel between the source and drain regions 143. Finally, because the unwanted dopant portions of the halo 140 have been removed in the trench etch (e.g., FIG. 5F) and replaced by tailored selectively doped and undoped silicon layers (146, 144 respectively), a diagonally graded halo profile (e.g., 5c of FIG. 1) toward the source/drain region 143 is also emulated. Thus a localized halo may be formed in association with a retrograde dopant concentration profile by simple processes and methods in accordance with the invention.

Figure 6:
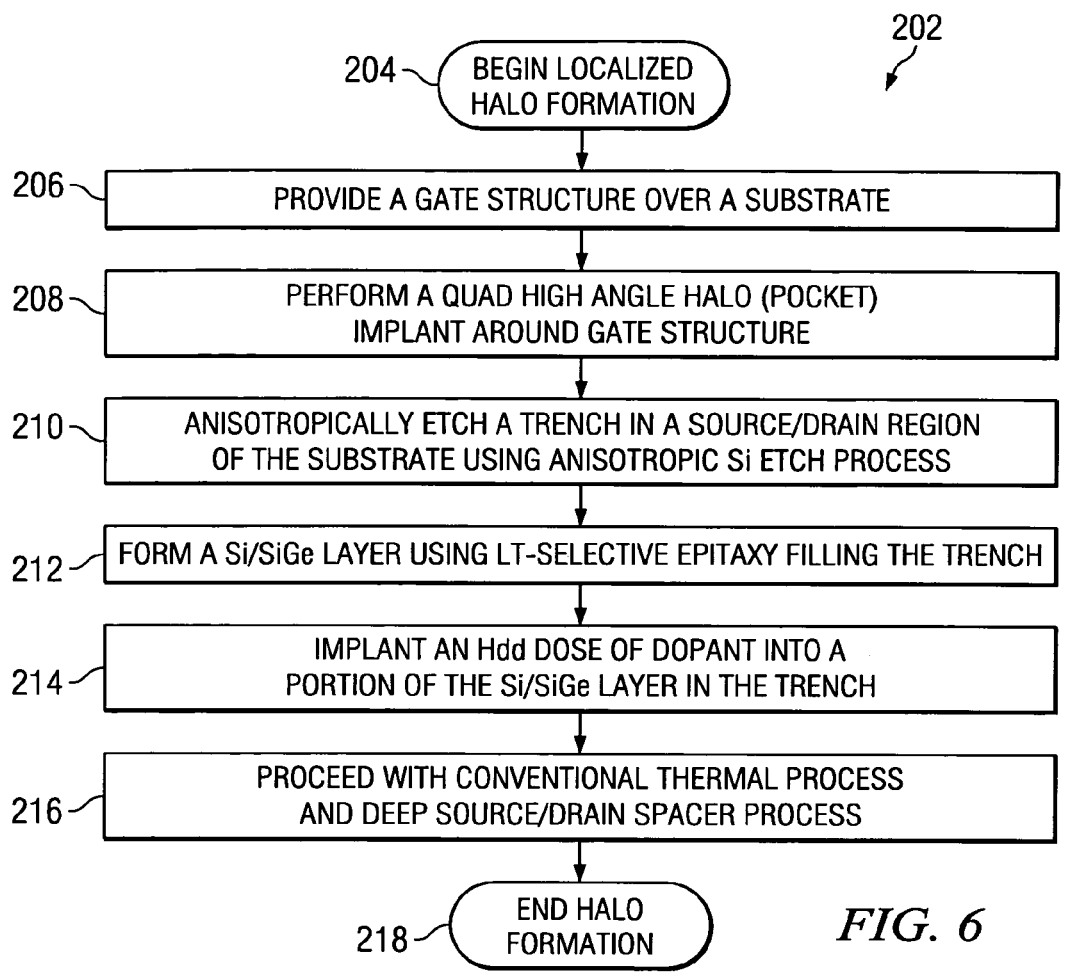
FIG. 6 is a flow diagram illustrating another exemplary method of forming a localized halo in a semiconductor device in accordance with the present invention.

FIG. 6 illustrates another exemplary method 202 for forming a localized halo structure in a semiconductor device in accordance with the present invention, wherein the trench (e.g., 142 of FIG. 5F) is filled substantially with an undoped (e.g., intrinsic), or low dose silicon material layer formed in the first LT-SE, and then implanting the filled silicon material trench with an HDD implant to form an overlying HDD material layer into the source/drain region of the device. Method 202 is otherwise similar to method 72 of FIG. 4A, and as such need not be completely described again for the sake of brevity.

Although the method 202 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The method 202 involves forming a halo structure within a silicon semiconductor substrate, the halo being localized to an area underlying a gate structure in a MOS transistor of a semiconductor device. Beginning at 204, the halo formation method 202 comprises providing the gate structure, which has been formed over the semiconductor substrate at 206 of the semiconductor device. An upper oxi-nitride layer may be provided over a polysilicon layer of the gate structure, which serves as a hard mask for later etching of a trench. A polysilicon material layer is typically formed over a gate-oxide layer, and an offset spacer comprising an oxide material is formed surrounding the gate-oxide material layer, the polysilicon material layer, and the oxi-nitride hard mask layer.

The method 202 proceeds as before with a quad high-angle halo implant at 208, and the trench etch at 210. Thereafter, at 212 the trench is generally refilled with a silicon material (e.g., Si or SiGe) with a low temperature selective epitaxy, for example, to form a generally undoped silicon material layer within substantially the entire trench. At 214, the generally undoped silicon material layer receives an HDD implant to form an overlying HDD material layer in the trench that also comprises the source/drain region of the device.

Thereafter at 216, the method 202 comprises a thermal anneal process on the device, forming a spacer on lateral sidewalls of the gate structure, and performing a source/drain implant to form a source and drain region having, in one example, a depth that is less than the trench. Finally, the halo formation method 202 ends at 218, and subsequent conventional back-end processing may be provided.

When formed according to method 202, the halo structure and profile retains the same benefits described for method 72. However, the HDD dopant concentration profiling is different because the HDD dopant is implanted into the substrate surface in the source/drain region in method 202.

FIGS. 7A–7F illustrate another such implementation, wherein a localized halo is formed in a semiconductor substrate of a MOS transistor in a semiconductor device. The illustrated portions of the halo formation process involve the use of an oxi-nitride hard mask, polysilicon and gate oxide layers, as well as oxide materials in offset and sidewall spacers for use in forming a halo. However, it is noted at this point that the invention is not limited to such specific applications, and further that the structures illustrated and described hereinafter are not necessarily drawn to scale.

Figure 7A:
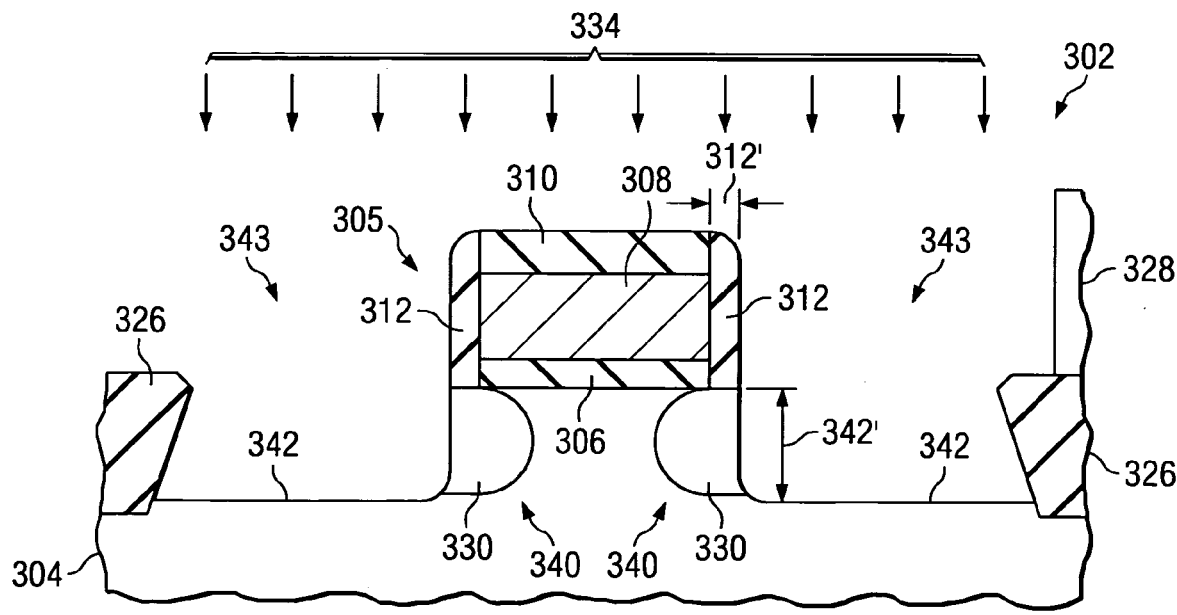
FIG. 7A is a partial cross-sectional side view illustrating another exemplary semiconductor device, having been processed similar to the device of FIGS. 5A–5F, wherein the device has been anisotropically etched to form a trench in a source/drain region of the semiconductor substrate, and further illustrating how the trench is employed to partially define the halo structure.

Preceding FIG. 7A, the method and processes exemplified by FIGS. 5A–5E of MOS device 102 are similar to that of MOS device 302, and as such need not be fully described again for the sake of brevity, except where noted. In FIG. 7A, a MOS transistor 302 is illustrated at an intermediate stage of fabrication processing of a semiconductor device, wherein the MOS transistor 302 has been formed on or in a semiconductor substrate 304, such as silicon or silicon-germanium.

Again in FIG. 7A, the MOS transistor 302 comprises a gate structure 305, which has been provided formed over the semiconductor substrate 304. Gate structure 305 comprises a gate-oxide material layer 306 formed over the semiconductor substrate 304, a polysilicon material layer 308 formed over the gate-oxide layer 306, and a hard mask layer 310 comprising an oxi-nitride material formed overlying the polysilicon material layer 308 and the gate-oxide material layer 306. An offset spacer 312 with a thickness 312' has been formed around the gate layers and over a portion of the semiconductor substrate 304.

FIG. 7A also illustrates that a high-angle implant was performed into the semiconductor substrate, guided between the offset spacer 312 and an STI 326 structure underlying a TAP 328 structure, and producing a halo dopant concentration area 330. FIG. 7A further illustrates that the MOS transistor 302 has received an anisotropic etch 334 to remove a portion of the halo dopant concentration area 330. A halo 340 is thus defined at the edge of a trench 342 etched to a depth 342' in a source/drain region 343 of the semiconductor substrate of the device.

Figure 7B:
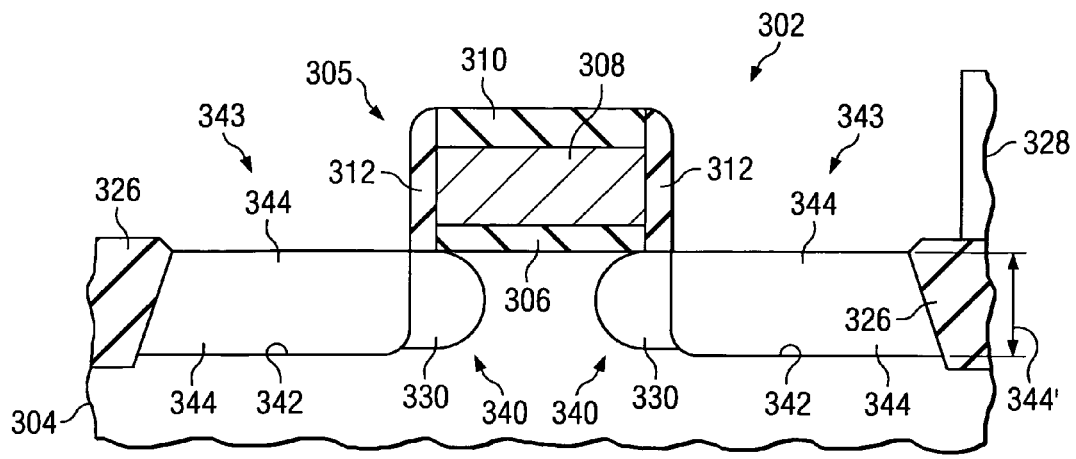
FIG. 7B is a partial cross-sectional side view illustrating an epitaxial deposition for forming a silicon material layer generally filling the trench of the device of FIG. 7A.

FIG. 7B illustrates an epitaxial deposition for forming a generally undoped or intrinsic silicon material layer 344 in the trench 342 of the MOS transistor device 302. The epitaxial deposition may, in accordance with an aspect of the invention, be a low temperature selective epitaxial deposition LT-SE, used to form the (e.g., undoped, or low dose) silicon material layer 344 to a depth 344', thereby substantially filling the trench. In this manner, the lower portion of the halo structure 340 may be kept isolated from source/drain current conduction paths formed subsequently.

Figure 7C:
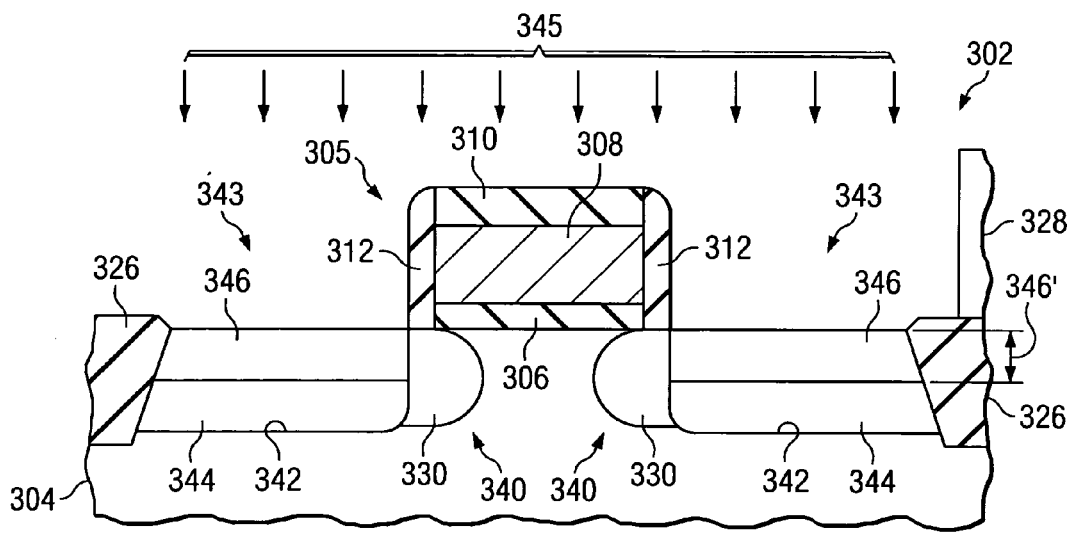
FIG. 7C is a partial cross-sectional side view illustrating formation of a highly doped silicon material layer implanted in the silicon material layer generally filling the trench of the device of FIG. 7B.

In FIG. 7C, the generally undoped silicon material layer 344 receives an HDD implant 345 to form an HDD material layer 346 in the source/drain region overlying the generally undoped silicon material layer 344. The HDD material layer 346 is implanted to a depth 346' in the trench 342 of the MOS transistor device 302, and is self-aligned with respect to the offset spacer 312. Note that although an offset spacer is employed in the above example, a simple liner oxide or other insulating material may be employed instead such that the LT-SE occurs primarily in the trench and is not associated with the poly gate. In such an instance, the HDD region 346 is substantially self-aligned with respect to the gate 305.

Figure 7D:
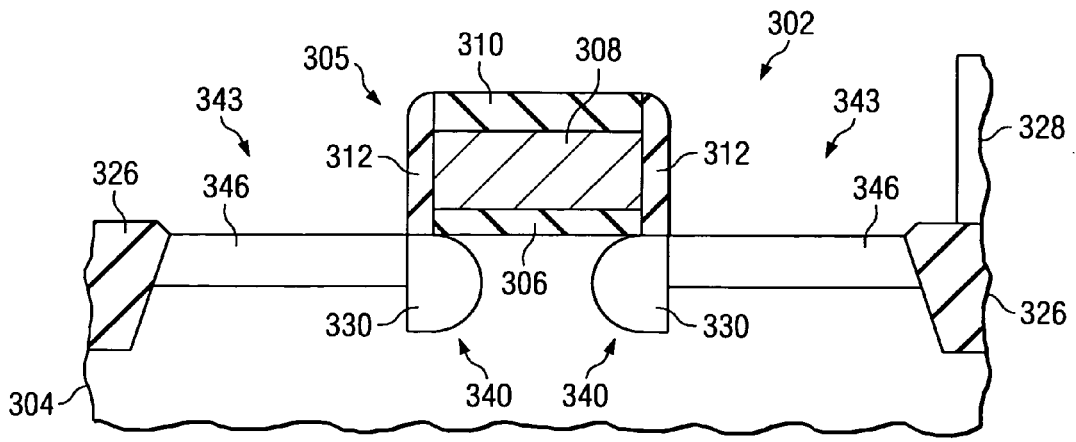
FIG. 7D is a partial cross-sectional side view illustrating the result of a thermal anneal process further illustrating the intrinsic silicon material layer blended into the semiconductor substrate at the bottom of the trench of the device of FIG. 7C.
Figure 7E:
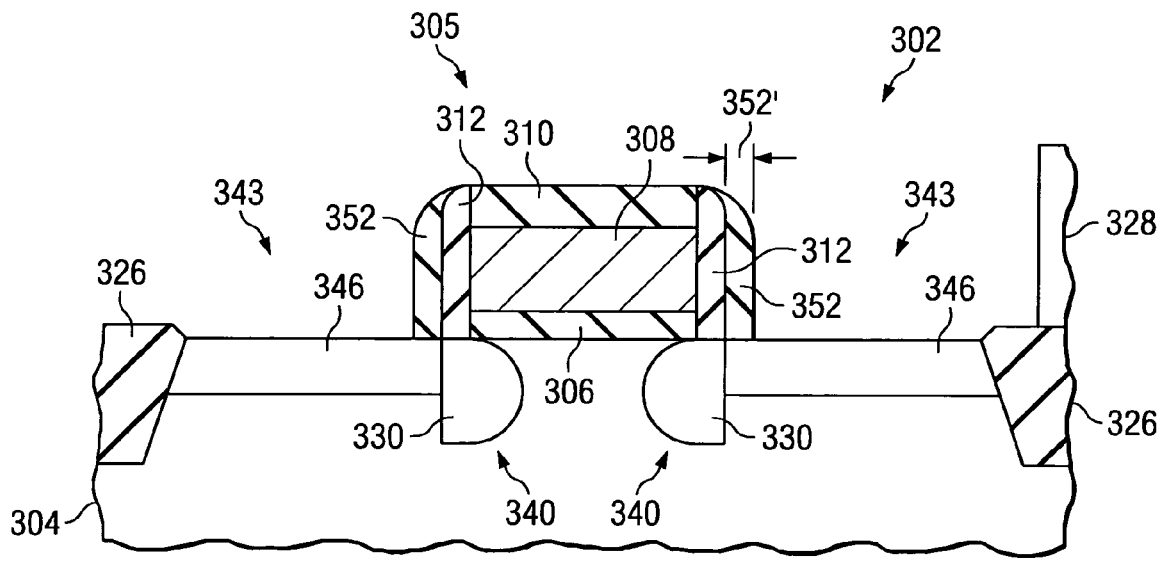
FIG. 7E is a partial cross-sectional side view illustrating formation of a sidewall spacer over the device of FIG. 7D.

FIG. 7D, illustrates the result of a conventional thermal anneal process on the MOS transistor device 302, illustrating a blending (Si crystalline repair or regrowth) of the intrinsic silicon material layer (e.g., 344 of FIG. 7C) within the lightly doped p-type semiconductor substrate 304 at the bottom of the trench 342. In FIG. 7E, a sidewall spacer 352 with a thickness 352' is formed over the offset spacer 312 of the gate structure 305 to guide a subsequent HDD deposition in the source/drain region 343.

Figure 7F:
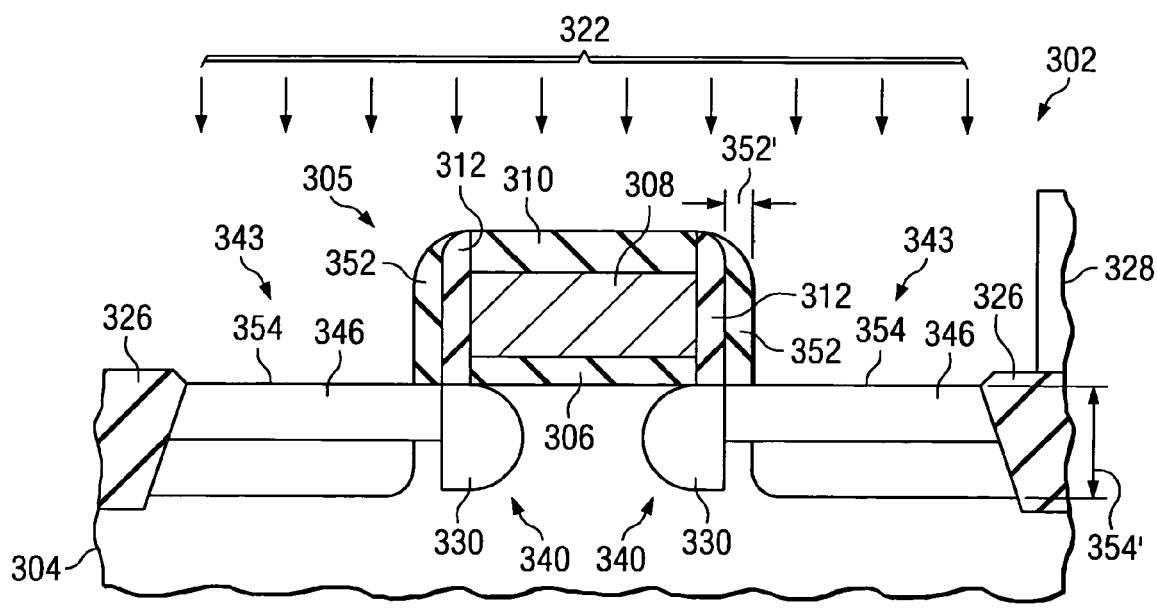
FIG. 7F is a partial cross-sectional side view illustrating a formation of a deep highly doped source/drain region in the device of FIG. 7E.

In FIG. 7F, a conventional deep source/drain deposition 354 is then typically performed, implanting an n-type material to a depth 354' into the source/drain region 343 of the semiconductor substrate 304 of the MOS transistor 302. Deposition 354 is guided by the sidewall spacer 352, and offset by the sidewall spacer thickness 352' from the gate structure 305.

Formed as such, a section of the implanted HDD material layer 346 is shown remaining to couple and direct the current flow up over the halo 340, and through the channel between the source and drain regions 343. Finally, because the unwanted dopant portions of the halo 340 have been removed in the trench etch (e.g., FIG. 7A) and replaced by implant tailored doped and generally undoped silicon layers (346, 344 respectively), a generally diagonally graded halo profile (e.g., 5c of FIG. 1) toward the source/drain region 343 is also emulated. Thus a localized halo may be formed in association with a retrograde dopant concentration profile in accordance with the invention.

It will be appreciated by those skilled in the art that the above methodologies may be employed in forming localized halos as part of NMOS or PMOS transistor and similar semiconductor device manufacturing processes.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method for forming a localized halo structure in a semiconductor substrate of a semiconductor device, comprising:
    providing a gate structure over the semiconductor substrate;
    implanting a dopant material at an angle around the gate structure to form a halo structure in a source/drain region of the semiconductor substrate and underlying a portion of the gate structure;
    forming a trench in the source/drain region of the semiconductor substrate, thereby removing at least a portion of the halo structure in the source/drain region; and
    forming a semiconductor material layer in the trench, comprising:
        forming an intrinsic silicon layer in a bottom portion of the trench; and
        forming a doped silicon layer in a top portion of the trench overlying the intrinsic silicon layer, wherein the trench is substantially filled having a generally undoped region in a bottom portion of the trench and a generally doped region in a top portion of the trench.

2. The method of claim 1, wherein the semiconductor material layer comprises silicon.

3. The method of claim 1, further comprising:
    thermally processing the device;
    forming a spacer on lateral sidewalls of the gate structure; and
    performing a source/drain implant into the semiconductor material layer in the trench to form a source and drain region.

4. The method of claim 3, wherein the trench has a depth, and wherein the source and drain region have a depth which is less than the trench depth.

5. The method of claim 3, wherein thermally processing the device comprises rapid thermal annealing to slightly grade a junction formed between the undoped silicon material layer and the doped silicon material layer in the trench.

6. A method for forming a localized halo structure in a semiconductor substrate of a semiconductor device, comprising:
    providing a gate structure over the semiconductor substrate;
    implanting a dopant material at an angle around the gate structure to form a halo structure in a source/drain region of the semiconductor substrate and underlying a portion of the gate structure;
    forming a trench in the source/drain region of the semiconductor substrate, thereby removing at least a portion of the halo structure in the source/drain region;
    forming a semiconductor material layer in the trench; and
    implanting an HDD dopant into a top portion of the trench.

7. The method of claim 6, further comprising:
    thermally processing the device;
    forming a spacer on lateral sidewalls of the gate structure; and
    performing a source/drain implant into the silicon material layer to form a source and drain region having a depth that is less than a depth of the trench.

8. The method of claim 1, wherein forming the trench comprises etching the semiconductor substrate in the source/drain region in a substantially anisotropic manner.

9. The method of claim 1, further comprising cleaning the device after the formation of the trench.

10. The method of claim 1, wherein a thickness of the intrinsic silicon layer is greater than a thickness of the doped silicon layer.

11. The method of claim 1, wherein the doped silicon material layer comprises one of Si doped with As, SiGe doped with As, Si doped with B and SiGe doped with and B.

12. The method of claim 1, wherein the step of forming the semiconductor material layer includes epitaxial deposition.

13. The method of claim 6, wherein forming the trench comprises etching the semiconductor substrate in the source/drain region in a substantially anisotropic manner.

14. The method of claim 6, further comprising cleaning the device after the formation of the trench.

* * * * *